(12) United States Patent
Takemura

(10) Patent No.: US 8,492,853 B2
(45) Date of Patent: Jul. 23, 2013

(54) FIELD EFFECT TRANSISTOR HAVING CONDUCTOR ELECTRODE IN CONTACT WITH SEMICONDUCTOR LAYER

(75) Inventor: Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 203 days.

(21) Appl. No.: 13/014,061

(22) Filed: Jan. 26, 2011

(65) Prior Publication Data
US 2011/0193078 A1      Aug. 11, 2011

(30) Foreign Application Priority Data

Feb. 10, 2010    (JP) .................................. 2010-027835

(51) Int. Cl.
*H01L 29/78* (2006.01)
(52) U.S. Cl.
USPC ................... 257/412; 257/288; 257/E29.255; 257/E21.41; 438/149
(58) Field of Classification Search
USPC ...... 257/288, 412, E29.255, E21.41; 438/149
See application file for complete search history.

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 6,104,040 A | 8/2000 | Kawachi et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |

(Continued)

FOREIGN PATENT DOCUMENTS

| | | |
|---|---|---|
| EP | 0816903 A | 1/1998 |
| EP | 1737044 A | 12/2006 |

(Continued)

OTHER PUBLICATIONS

International Search Report (Application No. PCT/JP2011/051033) Dated Mar. 1, 2011.

(Continued)

*Primary Examiner* — Thanh V Pham
(74) *Attorney, Agent, or Firm* — Eric J. Robinson; Robinson Intellectual Property Law Office, P.C.

(57) ABSTRACT

An object is to provide a structure with which the off-state current of a field effect transistor including a conductor-semiconductor junction can be reduced. A semiconductor layer is provided in contact with a first conductor electrode and a second conductor electrode which include a material with a work function that is at the same level as or lower than the electron affinity of the semiconductor layer. A third conductor electrode is formed using a material whose work function is higher than the electron affinity of the semiconductor layer to be in contact with a surface of the semiconductor layer opposite to a surface provided with a gate and to cross the semiconductor layer, so that a Schottky barrier junction is formed in the semiconductor layer. The carrier concentration of the portion including the Schottky barrier junction is extremely low; thus, the off-state current can be reduced.

12 Claims, 7 Drawing Sheets

U.S. PATENT DOCUMENTS

| | | | |
|---|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0193182 A1 | 8/2011 | Takemura |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 04-367265 A | 12/1992 |
| JP | 05-251705 A | 9/1993 |
| JP | 08-264794 A | 10/1996 |
| JP | 09-008317 A | 1/1997 |
| JP | 63-265818 A | 11/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-236180 A | 9/2005 |
| JP | 2006-253490 A | 9/2006 |
| WO | WO-2004/114391 | 12/2004 |

OTHER PUBLICATIONS

Written Opinion (Application No. PCT/JP2011/051033) Dated Mar. 1, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Phsyics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA Amoled Driven by the Threshold Voltage Controlled Amorphous GIZO (Ga2O3-ZnO) TFT,", SID Digest '08 : SID International Symposium Digest of Technical Papers, May 20, 2008, vol. 39, pp. 633-636.
Lee.J et al., "World's Largest (15-inch) XGA AMLCD Panel Using IgZo Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a charge-generation layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7. 2006, pp. 663-666.
Kikuchi.H et al., "62.2:Invited Paper:Fast Electro-Optical Switching in Polymer-Stabilized Liquid Crystallin Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 1, 2002, vol. 1, pp. 64-68.
Kimizuka.N. et al., "Spinel,YBFE2O4, and YB2FE3O7 Types of Structures for Compounds in the In2O3 and SC2O3-A2O3-BO Systems [A; FE, GA, OR AI; B: MG, MN, FE, NI, CU,OR ZN] at Temperatures Over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Song.I et al., "Short Channel Characteristics of Gallium-Indium-Zinc-Oxide Thin Film Transistors for Three-Dimensional Stacking Memory,", IEEE Electron Device Letters, Jun. 1, 2008, vol. 29, No. 6, pp. 549-552.

FIELD EFFECT TRANSISTOR HAVING CONDUCTOR ELECTRODE IN CONTACT WITH SEMICONDUCTOR LAYER

TECHNICAL FIELD

The present invention relates to a field effect transistor (FET) including a semiconductor.

BACKGROUND ART

A field effect transistor (FET) is a device in which regions called a source and a drain are provided in a semiconductor, each of the regions is provided with an electrode, potentials are supplied to the electrodes, and an electric field is applied to the semiconductor with the use of an electrode called a gate through an insulating film or a Schottky barrier so that the state of the semiconductor is controlled, whereby current flowing between the source and the drain is controlled. As the semiconductor, Group IV elements (Group 14 elements) such as silicon and germanium, Group III-V compounds such as gallium arsenide, indium phosphide, and gallium nitride, Group II-VI compounds such as zinc sulfide and cadmium telluride, and the like can be given.

In recent years, FETs in which an oxide such as zinc oxide or an indium gallium zinc oxide-based compound is used as a semiconductor have been reported (Patent Document 1 and Patent Document 2). In an FET including such an oxide semiconductor, relatively high mobility can be obtained, and such a material has a wide bandgap of greater than or equal to 3 electron volts; therefore, application of the FET including an oxide semiconductor to displays, power devices, and the like is discussed.

The fact that the bandgap of such a material is greater than or equal to 3 electron volts means that the material transmits visible light, for example; thus, in the case where the material is used in a display, even an FET portion can transmit light and the aperture ratio is expected to be improved.

Further, such a wide bandgap is common to silicon carbide, which is used in power devices; therefore, the oxide semiconductor is also expected to be applied to a power device.

Furthermore, a wide bandgap means few thermally excited carriers. For example, silicon has a bandgap of 1.1 electron volts at room temperature and thus thermally excited carriers exist therein at approximately $10^{11}/cm^3$, while in a semiconductor with a bandgap of 3.2 electron volts, thermally excited carriers exist at approximately $10^{-7}/cm^3$ according to calculation.

In the case of silicon, carriers generated by thermal excitation exist as described above even in silicon including no impurities, and thus the resistivity of the silicon cannot be higher than or equal to $10^5$ Ωcm. In contrast, in the case of the semiconductor with a bandgap of 3.2 electron volts, a resistivity of higher than or equal to $10^{20}$ Ωcm can be obtained in theory. When an FET is manufactured using such a semiconductor and its high resistivity in an off state (a state where the potential of a gate is the same as the potential of a source) is utilized, it is expected that electric charge can be retained semipermanently.

Meanwhile, there are few reports on an oxide semiconductor which includes zinc or indium in particular and has p-type conductivity. Accordingly, an FET of an oxide semiconductor using a PN junction like an FET of silicon has not been reported, and a conductor-semiconductor junction as disclosed in Patent Document 1 and Patent Document 2, where a conductor electrode is in contact with an n-type oxide semiconductor, has been used for forming a terminal corresponding to a source or a drain.

Note that in general academic books about semiconductors, the "conductor-semiconductor junction" is expressed as a "metal-semiconductor junction." In this case, metal means a conductor. For example, a semiconductor such as silicon (a degenerated semiconductor in particular) which is doped at a high concentration and whose resistivity is significantly lowered, metal nitrides such as titanium nitride and tungsten nitride, metal oxides such as indium tin oxide and aluminum zinc oxide, and the like are also regarded as metal in "metal-semiconductor junctions." However, in such a case, the term "metal" might cause misunderstanding; therefore, the term "conductor-semiconductor junction" is used instead of the term "metal-semiconductor junction" in this specification.

In an FET where terminals corresponding to a source and a drain are formed with the use of a conductor-semiconductor junction, when the carrier concentration of the semiconductor is high, current (off-state current) flows between the source electrode and the drain electrode even in an off state. Thus, the off-state current needs to be reduced by lowering the concentration of a donor or an acceptor in the semiconductor so that an i-type semiconductor is obtained. Note that in this specification, an i-type semiconductor is a semiconductor whose carrier concentration derived from a donor or an acceptor is lower than or equal to $10^{12}/cm^3$. However, it is apparent from the following that such an attempt does not work when the channel length of an FET is short and a semiconductor layer is thick.

In a conductor-semiconductor junction, in general, an ohmic junction or a Schottky barrier junction is formed depending on the relation between a work function of a conductor and an electron affinity (or a Fermi level) of a semiconductor. For example, if an ideal conductor-semiconductor junction (i.e., a junction where a compound, a trap level, or the like does not exist at the interface) is formed by making a conductor with a work function of 3.9 electron volts in contact with a semiconductor with an electron affinity of 4.3 electron volts, electrons flow from the conductor into a region which is in the semiconductor and has a certain width.

In that case, a region closer to a junction interface between the conductor and the semiconductor has a higher electron concentration, and the electron concentrations are $10^{20}/cm^3$ at several nanometers from the interface of the conductor-semiconductor junction, $10^{18}/cm^3$ at several tens of nanometers from the interface, $10^{16}/cm^3$ at several hundreds of nanometers from the interface, and $10^{14}/cm^3$ even at several micrometers from the interface according to rough calculation. That is, even when the semiconductor itself is an i-type semiconductor, contact with a conductor produces a region with a high carrier concentration. As a result of formation of such a region including many carriers in the vicinity of the interface of the conductor-semiconductor junction, the conductor-semiconductor junction becomes an ohmic junction.

In contrast, for example, if an ideal conductor-semiconductor junction is formed by making a conductor with a work function of 4.9 electron volts in contact with a semiconductor with an electron affinity of 4.3 electron volts, electrons existing in a region which is in the semiconductor and has a certain width move to the conductor. In a region which the electrons have left, the electron concentration is, as is obvious, extremely low. The width of the region of the semiconductor to which electrons move depends on the electron concentration of the semiconductor; for example, when an original electron concentration of the semiconductor is $10^{18}/cm^3$, the width is several tens of nanometers.

The electron concentration in this portion becomes significantly low; accordingly, a barrier is formed at a junction interface between the conductor and the semiconductor in a band diagram. A conductor-semiconductor junction including such a barrier is referred to as a Schottky barrier junction. Electrons easily flow from the semiconductor to the conductor, whereas electrons are less likely to flow from the conductor to the semiconductor owing to the barrier. Therefore, rectification action is observed in the Schottky barrier junction.

A similar phenomenon occurs even when a conductor is not in direct contact with a semiconductor. For example, even in the case where an insulating film is provided between a semiconductor and a conductor, the electron concentration of the semiconductor is influenced by the conductor. Needless to say, the degree of the influence of the conductor depends on the thickness or the dielectric constant of the insulating film. When the thickness of the insulating film is increased or when the dielectric constant thereof is lowered, the influence of the conductor is reduced.

In an FET, since it is preferable that a junction between a source electrode and a semiconductor or between a drain electrode and the semiconductor be formed so that current flows easily, a material of the source electrode or the drain electrode is selected so that an ohmic junction is formed. For example, titanium and titanium nitride are given. When a junction between an electrode and a semiconductor is an ohmic junction, there are advantages of stable characteristics of an FET to be obtained and of high percentage of non-defective products.

As a material of a gate, a material having action that eliminates electrons from a semiconductor is selected. For example, tungsten and platinum are given. When such a material is used and a ratio L/T, where L is the size of a semiconductor (typically, the distance between a source electrode and a drain electrode) and T is the sum of the effective thicknesses of a gate insulating film and the semiconductor, is greater than or equal to 10, an FET having an extremely small off-state current of less than or equal to $1 \times 10^{-18}$ A can be manufactured. Here, T is calculated by the following formula: T=(the thickness of a gate insulating film×the dielectric constant of a semiconductor/the dielectric constant of the gate insulating film)+the thickness of the semiconductor.

The ratio L/T is required to be low because of a need to increase current in an on state (on-state current), a limit of a technique of forming a thin film, miniaturization, or the like. When a semiconductor layer is made thicker, for example, the cross-sectional area thereof is increased; thus, larger current can flow. Further, when the thickness of a semiconductor layer or a gate insulating layer is reduced to the limit of mass production and a channel (the distance between the source electrode and the drain electrode) is shortened, L becomes small relative to T. In addition, for an application to a power device, the thickness of the gate insulating film needs to be increased in order to increase withstand voltage.

With such a structure, however, it is impossible to keep the off-state current low when the ratio L/T is less than or equal to 4. A similar phenomenon can be observed when L is less than 100 nm or when T is greater than or equal to 1 μm. A cause of that phenomenon is described with reference to FIGS. 7A and 7B. FIG. 7A illustrates a typical structure of an FET including a conductor-semiconductor junction. Specifically, a source electrode 13a and a drain electrode 13b are provided on one surface of a semiconductor layer 11. Further, a gate insulating film 14 and a gate 15 are provided over an opposite surface of the semiconductor layer 11.

As the source electrode 13a and the drain electrode 13b, a conductor is selected so that a junction between the source electrode 13a and the semiconductor layer 11 and a junction between the drain electrode 13b and the semiconductor layer 11 are ohmic junctions. By using a material whose work function is higher than the electron affinity of the semiconductor for the gate 15, electrons flowing from the source electrode 13a or the drain electrode 13b are eliminated.

In order to simplify the explanation, it is assumed that a force of the source electrode 13a or the drain electrode 13b for injecting electrons into the semiconductor layer 11 is equal to a force of the gate 15 for eliminating electrons from the semiconductor layer 11. The forces are thought to depend on respective distances from the source electrode 13a (or the drain electrode 13b) and the gate 15 to a point.

In a portion of the semiconductor layer 11 where the distances from the source electrode 13a (or the drain electrode 13b) and the gate 15 are equal, the opposing forces are balanced; therefore, it can be thought that the electron concentration therein is equal to an original value. When the distance from the source electrode 13a is shorter than the distance from the gate 15 in a position, the force of the source electrode 13a is stronger than that of the gate 15; thus, the electron concentration is higher at the position. In contrast, when the former distance is longer than the latter distance in another position, the force of the gate 15 is stronger than that of the source electrode 13a; thus, the electron concentration is lower at the position.

Here, it should be noted that the distance in this case means not a spatial distance but an electromagnetic distance; therefore, the comparison needs to be made on the basis of a value obtained by multiplying a spatial distance by a dielectric constant.

FIG. 7B illustrates conceptual isoconcentration lines of the electron concentration in the semiconductor layer 11 of the FET in FIG. 7A, which is based on the above premise. In order to simplify the explanation, the dielectric constant of the gate insulating film 14 is assumed to be equal to the dielectric constant of the semiconductor layer 11. In addition, the potentials of the source electrode 13a and the drain electrode 13b are equal to the potential of the gate 15.

There are regions 1a where the electron concentration is high in the vicinity of an interface between the semiconductor layer 11 and the source electrode 13a and the drain electrode 13b. Further, regions 1b where the electron concentration is lower than the electron concentration in the regions 1a by approximately one order of magnitude, regions 1c where the electron concentration is lower than that in the regions 1b by approximately one order of magnitude, a region 1d where the electron concentration is lower than that in the regions 1c by approximately one order of magnitude, and a region 1e where the electron concentration is lower than that in the region 1d exist outside the regions 1a in this order.

It should be noted that the region 1d is not divided on a side opposite to the gate 15 in the semiconductor layer 11. This is because the force of the gate 15 does not reach that region and electrons are injected by the forces of the source electrode 13a and the drain electrode 13b.

In the drawing, the ratio L/T is a little less than 2. Assuming that the distance between the source electrode 13a and the drain electrode 13b is 120 nm, the thickness of the semiconductor layer 11 is 50 nm; thus, the electron concentration on the isoconcentration line between the region 1a and the region 1b is approximately $10^{20}/cm^3$, and the electron concentration on the isoconcentration line between the region 1d and the region 1e is approximately $10^{17}/cm^3$.

Assuming that the distance between the source electrode 13a and the drain electrode 13b is 1.2 µm, the thickness of the semiconductor layer 11 is 0.5 µm; thus, the electron concentration on the isoconcentration line between the region 1a and the region 1b is approximately $10^{18}/cm^3$, and the electron concentration on the isoconcentration line between the region 1d and the region 1e is approximately $10^{15}/cm^3$.

Although an electron concentration of $10^{15}/cm^3$ seems low enough, the value is approximately 1 kΩcm in resistivity. As illustrated in the drawing, in one third or more part of the semiconductor layer, the electron concentration is higher than or equal to $10^{15}/cm^3$. Accordingly, in an FET in which the channel length and the channel width are equal, the resistance is approximately 10 MΩ and the off-state current is as large as 0.1 µA in the case where the potential difference between the source electrode 13a and the drain electrode 13b is 1 V.

In short, in order to reduce the off-state current, the electron concentration on the side opposite to the gate needs to be prevented from being such an unignorable value. For that purpose, a method in which the thickness of the semiconductor layer 11 is reduced can be considered. In other words, a region which is not influenced by the gate 15 may be reduced. In the case of the FET in the drawing, calculation results indicate that the off-state current can be reduced to one hundred-thousandth when the thickness of the semiconductor layer 11 is reduced by half, for example.

However, in an extremely small device in which the distance between the source electrode 13a and the drain electrode 13b is 24 nm, for example, the thickness of the semiconductor layer 11 needs to be less than or equal to 2.5 nm and thus it is technically difficult to uniformly form the semiconductor layer 11 with such a small thickness. Moreover, reduction in the thickness of the semiconductor layer 11 leads to smaller on-state current.

A second method is to make the gate insulating film 14 thinner. When the thickness of the gate insulating film 14 in the drawing is reduced to one sixth or less, the influence of the gate 15 can reach the back surface of the semiconductor layer 11. However, as in the above example, when the distance between the source electrode 13a and the drain electrode 13b is 24 nm, the gate insulating film 14 needs to have a thickness of less than or equal to 0.8 nm.

A gate insulating film is formed over an oxide semiconductor by a sputtering method or a CVD method. It is difficult to form, by these methods, an insulating film having high quality and a uniform thickness like an insulating film of silicon formed by a thermal oxidation method; therefore, these methods are not realistic.

The above consideration is based on the premise that the force of the source electrode 13a or the drain electrode 13b for injecting electrons into the semiconductor layer 11 is equal to the force of the gate 15 for eliminating electrons from the semiconductor layer 11. When the former force is stronger than the latter force, more electrons are injected from the source electrode 13a or the drain electrode 13b into the semiconductor layer 11.

REFERENCE

Patent Document

[Patent Document 1] United States Published Patent Application No. 2005/0199879
[Patent Document 2] United States Published Patent Application No. 2007/0194379

DISCLOSURE OF INVENTION

An object of the present invention is to provide at least one of the following: a novel semiconductor device including a conductor-semiconductor junction; a novel field effect transistor including a conductor-semiconductor junction; a method for manufacturing the novel semiconductor device; and a method for manufacturing the novel field effect transistor. Another object of the present invention is to provide a method which is effective to the above-described problem in that the off-state current of an FET including a conductor-semiconductor junction is increased by changing the size of the FET. In particular, it is an object to provide a novel structure with which the off-state current of an FET, where the ratio L/T is less than or equal to 2, L is less than 100 nm, or T is greater than or equal to 1 µm, is small enough for practical use. According to the present invention, at least one of the above objects is achieved.

Before the present invention is described, terms used in this specification will be briefly explained. First, as for a source and a drain of a transistor in this specification, a terminal supplied with a higher potential is referred to as a drain and the other terminal is referred to as a source in an n-channel FET, and a terminal supplied with a lower potential is referred to as a drain and the other terminal is referred to as a source in a p-channel FET. In the case where the same potential is supplied to the two terminals, one of them is referred to as a source and the other is referred to as a drain. In addition, the terms "first conductor electrode" and "second conductor electrode" are used instead of the terms "source electrode" and "drain electrode" in some cases. In that case, the names are not changed depending on the level of a potential.

An embodiment of the present invention is an FET including a semiconductor layer, first and second conductor electrodes provided in contact with one surface of the semiconductor layer, and a gate provided over an opposite surface of the semiconductor layer. The FET further includes a third conductor electrode provided between the first conductor electrode and the second conductor electrode so as to cross the semiconductor layer. Another embodiment of the present invention is an FET including a semiconductor layer, first and second conductor electrodes provided in contact with one surface of the semiconductor layer, and a gate provided over the one surface of the semiconductor layer. The FET further includes a third conductor electrode provided on an opposite surface of the semiconductor layer so as to cross the semiconductor layer. In the above structure, the third conductor electrode is preferably formed so as to hinder current flow from the first conductor electrode to the second conductor electrode. Alternatively, the third conductor electrode is preferably formed between the first conductor electrode and the second conductor electrode. Further alternatively, the third conductor electrode is preferably provided so that a portion where the third conductor electrode is in contact with the semiconductor layer is positioned between a portion where the first conductor electrode is in contact with the semiconductor layer and a portion where the second conductor electrode is in contact with the semiconductor layer.

In the above structure, it is preferable that the third conductor electrode be in contact with only one of the first and second conductor electrodes or be kept at the same potential as only one of the first and second conductor electrodes.

In addition to the above structure, a fourth conductor electrode may be provided on the surface where the third conductor electrode is provided, so as to cross the semiconductor layer. The fourth conductor electrode is preferably provided to be apart from the third conductor electrode. In that case, it is preferable that the third conductor electrode be in contact with one of the first and second conductor electrodes or be kept at the same potential as one of the first and second conductor electrodes, and that the fourth conductor electrode be in contact with the other of the first and second conductor electrodes or be kept at the same potential as the other of the first and second conductor electrodes.

Further, the semiconductor layer may be doped to have a first doped region and a second doped region which include a donor or an acceptor at a high concentration, and the first doped region and the second doped region may be in contact with the first conductor electrode and the second conductor electrode, respectively. The concentration of a donor or an acceptor in the first and second doped regions may be set to higher than or equal to $1 \times 10^{18}/cm^3$ and lower than $1 \times 10^{21}/cm^3$, preferably higher than or equal to $1 \times 10^{19}/cm^3$ and lower than $1 \times 10^{20}/cm^3$.

In the above structure, it is preferable that the portions of the first and second conductor electrodes, which are in contact with the semiconductor layer, have a work function of lower than the sum of the electron affinity of the semiconductor layer and 0.3 electron volts (i.e., the electron affinity+0.3 electron volts). Alternatively, it is preferable that ohmic junctions be formed between the first and second conductor electrodes and the semiconductor layer.

Further, it is preferable that one or both of portions of the third and fourth conductor electrodes, which are in contact with the semiconductor layer, have a work function of higher than the sum of the electron affinity of the semiconductor layer and 0.6 electron volts (i.e., the electron affinity+0.6 electron volts). Alternatively, it is preferable that a Schottky barrier junction be formed between one or both of the third and fourth conductor electrodes and the semiconductor layer. In addition, the work function of the gate is preferably higher than the electron affinity of the semiconductor layer.

Furthermore, a gate insulating film may be provided between the semiconductor layer and the gate. Alternatively, a Schottky barrier junction may be formed between the semiconductor layer and the gate. In addition, it is not necessary that the first conductor electrode and the second conductor electrode are formed using the same material.

Note that the kind of the semiconductor layer is not limited to an oxide, and a Group II-VI compound such as a sulfide may be used. In addition, the bandgap of the semiconductor is preferably greater than or equal to 2 electron volts and less than 4 electron volts, further preferably greater than or equal to 2.9 electron volts and less than 3.5 electron volts.

An FET of the present invention will be described below with reference to drawings. The terms used herein are basically the same as the terms used in the above description. Therefore, conditions for the components denoted by the terms used in the above description may be applied to components denoted by the same terms. For example, in the case where a first conductor electrode is described below, the work function thereof may be in the range given in the above description.

FIGS. 1A to 1C illustrate an example of the FET of the present invention. The FET in FIG. 1A includes a semiconductor layer 1; a first conductor electrode 3a, a second conductor electrode 3b, and a third conductor electrode 2 on one surface of the semiconductor layer 1; and a gate 5 over an opposite surface of the semiconductor layer 1 with a gate insulating film 4 provided therebetween.

FIG. 1B schematically illustrates the FET in FIG. 1A seen from the below. The FET in FIG. 1A may be formed over a substrate. The substrate is not illustrated here in order to facilitate understanding. As illustrated in FIG. 1B, the third conductor electrode 2 is provided so as to cross the semiconductor layer 1.

The third conductor electrode 2 is not in contact with the first conductor electrode 3a and the second conductor electrode 3b in the FET, but may be configured to have the same potential as one of the first conductor electrode 3a and the second conductor electrode 3b through a wiring or the like. With such a structure, carriers (electrons in the case of an n-channel FET) flowing into the third conductor electrode 2 while in use for some reasons can be easily eliminated.

FIG. 2A illustrates another example of the FET of the present invention. The FET in FIG. 2A includes the semiconductor layer 1; the first conductor electrode 3a and the second conductor electrode 3b on one surface of the semiconductor layer 1; and the gate 5 over the one surface of the semiconductor layer 1 with the gate insulating film 4 provided therebetween. Further, the third conductor electrode 2 is provided on an opposite surface of the semiconductor layer.

A first doped region 6a and a second doped region 6b in which the donor concentration is high as a result of doping are provided in the semiconductor layer 1 so as to be in contact with the first conductor electrode 3a and the second conductor electrode 3b, respectively. The first doped region 6a and the second doped region 6b are preferably formed in a self-aligned manner with the use of the gate 5 as a mask. The first doped region 6a and the second doped region 6b are formed to be apart from each other.

FIG. 2B illustrates another example of the FET of the present invention. The FET in FIG. 2B includes the semiconductor layer 1; and the first conductor electrode 3a, the second conductor electrode 3b, and the third conductor electrode 2 on one surface of the semiconductor layer 1. Further, the gate 5 is provided over an opposite surface of the semiconductor layer 1 with the gate insulating film 4 provided therebetween. The semiconductor layer 1 has the first doped region 6a and the second doped region 6b. The first doped region 6a and the second doped region 6b are formed to be apart from each other and in contact with the first conductor electrode 3a and the second conductor electrode 3b, respectively.

FIG. 2C illustrates another example of the FET of the present invention. The FET in FIG. 2C includes the semiconductor layer 1; the first conductor electrode 3a, the second conductor electrode 3b, and the third conductor electrode 2 on one surface of the semiconductor layer 1; and the gate 5 over an opposite surface of the semiconductor layer 1 with the gate insulating film 4 provided therebetween. Here, the third conductor electrode 2 is formed so as to be in contact with the first conductor electrode 3a. The third conductor electrode 2 may be formed so as to be in contact with the second conductor electrode 3b instead of the first conductor electrode 3a.

FIG. 2D illustrates another example of the FET of the present invention. The FET in FIG. 2D includes the semiconductor layer 1; the first conductor electrode 3a, the second conductor electrode 3b, a third conductor electrode 2a, and a fourth conductor electrode 2b on one surface of the semiconductor layer 1; and the gate 5 over an opposite surface of the semiconductor layer 1 with the gate insulating film 4 provided therebetween. Here, the third conductor electrode 2a and the fourth conductor electrode 2b are formed so as to be in contact with the first conductor electrode 3a and the second conductor electrode 3b, respectively.

FIG. 3A illustrates another example of the FET of the present invention. The FET in FIG. 3A includes the semiconductor layer 1; the first conductor electrode 3a and the second conductor electrode 3b on one surface of the semiconductor layer 1; and the gate 5 over the one surface of the semiconductor layer 1 with the gate insulating film 4 provided therebetween. Further, the third conductor electrode 2 is provided on an opposite surface of the semiconductor layer.

The first doped region 6a and the second doped region 6b are formed to be apart from each other in the semiconductor layer 1, and are in contact with the first conductor electrode 3a and the second conductor electrode 3b, respectively. The third conductor electrode 2 is formed so as to be in contact with the first doped region 6a. The third conductor electrode 2 may be formed so as to be in contact with the second doped region 6b instead of the first doped region 6a.

FIG. 3B illustrates another example of the FET of the present invention. The FET in FIG. 3B includes the semiconductor layer 1; and the first conductor electrode 3a, the second conductor electrode 3b, and the third conductor electrode 2 on one surface of the semiconductor layer 1. Further, the gate 5 is provided over an opposite surface of the semiconductor layer with the gate insulating film 4 provided therebetween.

The first doped region 6a and the second doped region 6b are formed to be apart from each other in the semiconductor layer 1, and are in contact with the first conductor electrode 3a and the second conductor electrode 3b, respectively. The third conductor electrode 2 is formed so as to be in contact with the first doped region 6a and the first conductor electrode 3a. The third conductor electrode 2 may be formed so as to be in contact with the second doped region 6b and the second conductor electrode 3b instead.

FIG. 3C illustrates another example of the FET of the present invention. The FET in FIG. 3C includes the semiconductor layer 1; the first conductor electrode 3a and the second conductor electrode 3b on one surface of the semiconductor layer 1; and the gate 5 over the one surface of the semiconductor layer 1 with the gate insulating film 4 provided therebetween. Further, the third conductor electrode 2a and the fourth conductor electrode 2b are provided on an opposite surface of the semiconductor layer.

The first doped region 6a and the second doped region 6b are formed to be apart from each other in the semiconductor layer 1, and are in contact with the first conductor electrode 3a and the second conductor electrode 3b, respectively. The third conductor electrode 2a is formed so as to be in contact with the first doped region 6a, and the fourth conductor electrode 2b is formed so as to be in contact with the second doped region 6b.

FIG. 3D illustrates another example of the FET of the present invention. The FET in FIG. 3D includes the semiconductor layer 1; and the first conductor electrode 3a, the second conductor electrode 3b, the third conductor electrode 2a, and the fourth conductor electrode 2b on one surface of the semiconductor layer 1. Further, the gate 5 is provided over an opposite surface of the semiconductor layer with the gate insulating film 4 provided therebetween.

The first doped region 6a and the second doped region 6b are formed to be apart from each other in the semiconductor layer 1, and are in contact with the first conductor electrode 3a and the second conductor electrode 3b, respectively. The third conductor electrode 2a is formed so as to be in contact with the first doped region 6a and the first conductor electrode 3a, and the fourth conductor electrode 2b is formed so as to be in contact with the second doped region 6b and the second conductor electrode 3b.

By employing any of the above structures, at least one of the above objects can be achieved. An effect of an embodiment of the present invention will be described with reference to FIGS. 1A to 1C. FIG. 1A illustrates a cross section of the FET which is an example of the present invention. Specifically, in the FET including the semiconductor layer 1, the first and second conductor electrodes 3a and 3b provided in contact with one surface of the semiconductor layer 1, and the gate 5 provided over the opposite surface of the semiconductor layer with the gate insulating film 4 provided therebetween, the third conductor electrode 2 is provided between the first conductor electrode 3a and the second conductor electrode 3b so as to cross the semiconductor layer 1.

The reason why the off-state current is small in an FET having such a structure will be described with reference to FIG. 1C. In FIG. 1C, the gate 5, the first conductor electrode 3a, the second conductor electrode 3b, and the third conductor electrode 2 are kept at the same potential. Here, for simplicity, conditions of the gate 5, the first conductor electrode 3a, the second conductor electrode 3b, the semiconductor layer 1, and the gate insulating film 4 are the same as those used in the description of FIGS. 7A and 7B. The work function of the third conductor electrode 2 is the same as the work function of a material used for the gate 5.

As in the case illustrated in FIG. 7B, electrons are injected into the semiconductor layer 1 from the first conductor electrode 3a and the second conductor electrode 3b; accordingly, regions with an extremely high electron concentration are formed in the vicinity of the first conductor electrode 3a and the second conductor electrode 3b, and a region located more distant from the first conductor electrode 3a or the second conductor electrode 3b has a lower electron concentration. In addition, electrons in the vicinity of the gate insulating film 4 are eliminated by action between the gate 5 and the semiconductor layer 1, and the electron concentration in the vicinity of the gate insulating film 4 is lowered.

However, unlike the case illustrated in FIG. 7B, the electron concentration in the vicinity of the third conductor electrode 2 is also extremely low. This is because a Schottky barrier junction is formed between the third conductor electrode 2 and the semiconductor layer 1. As a result, a region with a relatively high electron concentration is divided in a central portion of the FET, which is different from the case of FIG. 7B. Thus, the off-state current can be significantly reduced as compared to the FET illustrated in FIGS. 7A and 7B.

The above effect is remarkable when the force of the third conductor electrode 2 for absorbing electrons from the semiconductor layer 1 is stronger than the force of the first conductor electrode 3a or the second conductor electrode 3b for injecting electrons into the semiconductor layer 1. The strength of the forces depends on the work function or the electron affinity. Specifically, it is preferable that the work function of the third conductor electrode 2 be higher than the work function of the first conductor electrode 3a or the second conductor electrode 3b by 0.3 electron volts or more.

Alternatively, it is preferable that the work function of the first conductor electrode 3a or the second conductor electrode 3b be lower than the sum of the electron affinity of the semiconductor layer 1 and 0.3 electron volts (i.e., the electron affinity+0.3 electron volts) or that ohmic junctions be formed between the first and second conductor electrodes and the semiconductor layer.

Further alternatively, it is preferable that the work function of the third conductor electrode 2 be higher than the sum of the electron affinity of the semiconductor layer and 0.6 electron volts (i.e., the electron affinity+0.6 electron volts) or that a Schottky barrier junction be formed between the third conductor electrode 2 and the semiconductor layer 1. In addition, the work function of the gate is preferably higher than the electron affinity of the semiconductor layer.

Since a Schottky barrier junction is formed between the third conductor electrode 2 and the semiconductor layer 1, it is relatively easy for electrons to move from the semiconductor layer 1 to the third conductor electrode 2 but difficult to move inversely. In that case, electrons are accumulated in the third conductor electrode 2 and the action of the third conductor electrode 2 that eliminates electrons is enhanced; accordingly, the operation of the FET becomes unstable.

In order to avoid this phenomenon, the third conductor electrode 2 may be in contact with one of the first conductor electrode 3a and the second conductor electrode 3b through a wiring or the like or may be set at the same potential as one of the first conductor electrode 3a and the second conductor electrode 3b.

It is interesting that even in the case where the thickness of the semiconductor layer is increased in the FET illustrated in FIG. 1A, the distribution pattern of the electron concentration is basically the same as that illustrated in FIG. 1C.

In order to simplify the explanation, it is assumed that the force of the third conductor electrode 2 for eliminating electrons from the semiconductor layer 1 is equal to the force of the first conductor electrode 3a or the second conductor electrode 3b for injecting electrons into the semiconductor layer 1. In that case, as described with reference to FIGS. 7A and 7B, the strength of each of the forces depends on the distance from a point.

Here, a perpendicular line drawn from the third conductor electrode 2 to the gate 5 is assumed. The distance from any point on the line to the third conductor electrode 2 is shorter than that to the first conductor electrode 3a or the second conductor electrode 3b. Therefore, the influence of the third conductor electrode 2 is larger than that of the first conductor electrode 3a and the second conductor electrode 3b; as a result, the force for eliminating electrons is stronger than the force for injecting electrons. Consequently, the electron concentration becomes lower than an original electron concentration.

That is to say, the present invention is also suitable for a device in which the semiconductor layer 1 is stacked to be thick and larger current is generated. Although the case where the semiconductor layer 1 is made thick is considered above, a similar effect can also be observed in the present invention by increasing the thickness of the gate insulating film 4. In that case, the withstand voltage of the gate of the FET can be increased.

Here, when only the gate is kept at a positive potential for example, a region with a high electron concentration is formed in accordance with the potential in the vicinity of the gate insulating film 4 in the semiconductor layer 1 and is connected to a region with a high electron concentration (i.e., a region with low resistance) in the vicinity of the first conductor electrode 3a and the second conductor electrode 3b; thus, the FET is turned on.

Further, when the potential of the gate 5 is increased, the electron concentration of the semiconductor layer in the vicinity of the gate insulating film 4 is further increased. In addition, a region with a high electron concentration is formed also in a portion distant from the gate insulating film 4 and is connected to the region with a high electron concentration in the vicinity of the first conductor electrode 3a and the second conductor electrode 3b, so that the resistance of the FET is further lowered and larger current flows. However, if the semiconductor layer 1 is thin, the amount of flowing current is saturated at a certain stage even when the potential of the gate 5 is increased.

In contrast, when the semiconductor layer 1 is thick, a region with a high electron concentration can be formed in a region that is more distant from the gate insulating film as well by further increasing the potential of the gate 5; accordingly, larger current can be obtained. When the thickness of a semiconductor layer is increased in a conventional FET, the off-state current is increased owing to the reason described above; according to the present invention, the off-state current can be sufficiently low even when the thickness of a semiconductor layer is increased.

In order to obtain sufficiently low off-state current in accordance with the present invention, the carrier concentration derived from a donor or an acceptor is preferably lower than or equal to $10^{12}/cm^3$. This point should be noted particularly when the thickness of the semiconductor layer is increased. Note that a concentration of a donor (or an acceptor) in this specification is a concentration of an element, a chemical group, or the like which could be a donor (or an acceptor) multiplied by an ionization rate thereof. For example, in the case where a donor element is included at 2% and the ionization rate thereof is 0.005%, the donor concentration is 1 ppm (=0.02×0.00005).

Although the force for eliminating electrons is stronger than the force for injecting electrons at any point on the perpendicular line drawn from the third conductor electrode 2 to the gate 5 as described above, the difference between the distance between the third conductor electrode 2 and the point and the distance between the first conductor electrode 3a or the second conductor electrode 3b and the point is smaller as the point is distant from the third conductor electrode 2.

Therefore, there is a limit on reduction in the electron concentration and the electron concentration is close to an original electron concentration (i.e., an electron concentration derived from a donor or an acceptor) of the semiconductor layer 1. In such a case, the off-state current is determined by the original electron concentration of the semiconductor layer 1; therefore, if the value is not small enough, reduction in the off-state current is limited.

As for the above description, in the case where the semiconductor layer 1 is an oxide semiconductor, oxygen vacancies and the hydrogen concentration therein are preferably reduced as much as possible. This is because an oxygen vacancy or hydrogen serves as a donor. Further, inclusion of hydrogen causes unstable operation of an FET. The hydrogen concentration is preferably lower than or equal to $10^{18}/cm^3$.

Although an FET including a conductor-semiconductor junction is discussed above, an embodiment of the present invention can also be applied to an FET in which the donor concentration has a gradient. Especially in an FET in which a PN junction cannot be used for insulation, a source and a drain can be separated in accordance with the present invention.

In a junction between a conductor and a semiconductor, as described above, electrons are supplied from the conductor to the semiconductor or electrons are absorbed by the conductor from the semiconductor owing to a work function, an electron affinity, or the like. A similar phenomenon occurs in a junction between a region including a donor at a high concentration and a region including a donor at a low concentration.

For example, it is assumed that the donor concentration in a first region is $1\times10^{20}/cm^3$ and the donor concentration in a second region is $1\times10^{12}/cm^3$. In that case, electrons in the first region exist in the vicinity of a lower end of the conduction band in a band diagram, while electrons in the second region exist in the vicinity of the center of the bandgap. That is, the electrons in the first region have a higher energy potential than the electrons in the second region.

If the first region and the second region are joined, the electrons in the first region flow into the second region owing to a difference in the energy potential. Assuming that the electron concentration in the first region is as relatively high as $1\times10^{20}/cm^3$, electrons are thought to be supplied in a manner similar to that in the case where the second region is in contact with a conductor; thus, the electrons flow into a considerably deep portion of the second region.

The depth to which the electrons flow depends on a ratio between the level of the energy potential of an electron in the second region and the level of the energy potential of an electron in the first region, that is, a ratio between the electron concentration in the second region and the electron concentration in the first region. When the electron concentration in the second region is lower, electrons are injected from the first region into a deeper portion of the second region. Needless to say, electrons injected in such a manner cause increase in off-state current.

In particular, when the case of silicon and the case of a semiconductor having a wider bandgap are compared, electrons are injected into a deeper portion of the second region in the latter case. This is because, in the latter case, the bandgap is wider and thus the difference in the energy potential between an electron in the first region and an electron in the second region is larger.

In order to prevent such flow of carriers from a region including a donor at a high concentration, the third conductor electrode described above may be provided so that a Schottky barrier junction is formed and a region with an extremely low electron concentration as illustrated in FIG. 1C is formed in the semiconductor layer.

Note that in the above FET, when the third conductor electrode 2 is kept at the same potential as the first conductor electrode 3a and, in addition, when a potential supplied to the first conductor electrode 3a is higher than a potential supplied to the second conductor electrode 3b, the area of such a Schottky barrier junction is reduced and electrons flow from the second conductor electrode 3b into the semiconductor layer 1.

For prevention of such a phenomenon, a circuit may be designed so that the potential of the first conductor electrode 3a is always higher than the potential of the second conductor electrode 3b, or a fourth conductor electrode may be provided in addition to the third conductor electrode so as to have the same potential as the second conductor electrode 3b as illustrated in FIG. 2D, FIG. 3C, or FIG. 3D.

Such a structure is effective for a transistor in a circuit where current flows back and forth between a first conductor electrode and a second conductor electrode, such as a memory cell of a dynamic random access memory (DRAM) or the like, or for a switching transistor in an active matrix display device.

The work function of a conductor is discussed in the above description. The work function of a conductor may be a value determined by an interface with a semiconductor in a simplest assumption; however, a complex physical property such as generation of a compound of the semiconductor and the conductor due to chemical reaction or a trap of electric charge or another element is often observed at the interface in reality.

In the case where a first conductor layer with an extremely small thickness of less than or equal to several nanometers and a second conductor layer with a relatively large thickness are stacked over a semiconductor layer in this order, for example, the influence of the work function of the first conductor layer is considerably reduced. Therefore, in application of the present invention, the design may be performed so that the work function or the like of each material at a position that is 5 nm away from an interface with the semiconductor layer satisfies favorable conditions of the present invention.

As a material of the third conductor electrode, a material which is chemically stable to the semiconductor layer, for example, noble metal such as platinum or palladium is preferably used. When an oxide is used for the semiconductor layer, an oxide conductor may be used as the material of the third conductor electrode.

The present invention is particularly effective for a semiconductor material in which substantially only one of an electron and a hole can be used as a carrier. In other words, a favorable result can be obtained in accordance with the present invention, for example, in the case where the mobility of one of the electron and the hole is higher than or equal to 1 $cm^2/Vs$ whereas the mobility of the other is lower than or equal to 0.01 $cm^2/Vs$, the other does not exist as a carrier, or the effective mass of the other is 100 times or more as large as that of a free electron.

BEST MODE FOR CARRYING OUT THE INVENTION

Figure 1A:
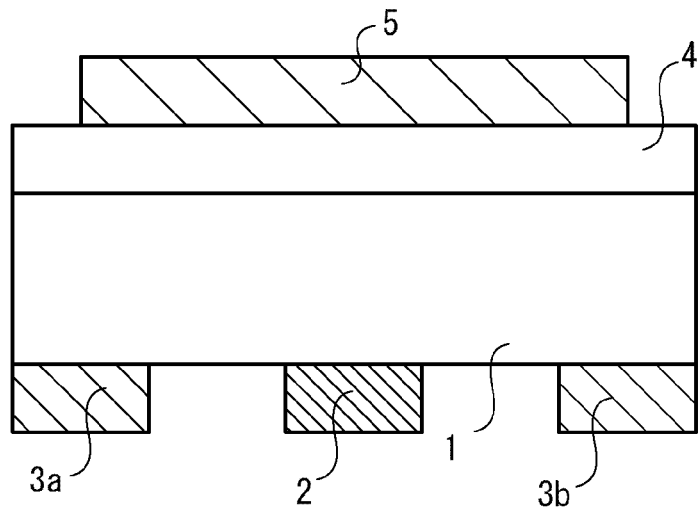
FIGS. 1A to 1C illustrate an example of a field effect transistor of the present invention and a principle of operation thereof.
Figure 1B:
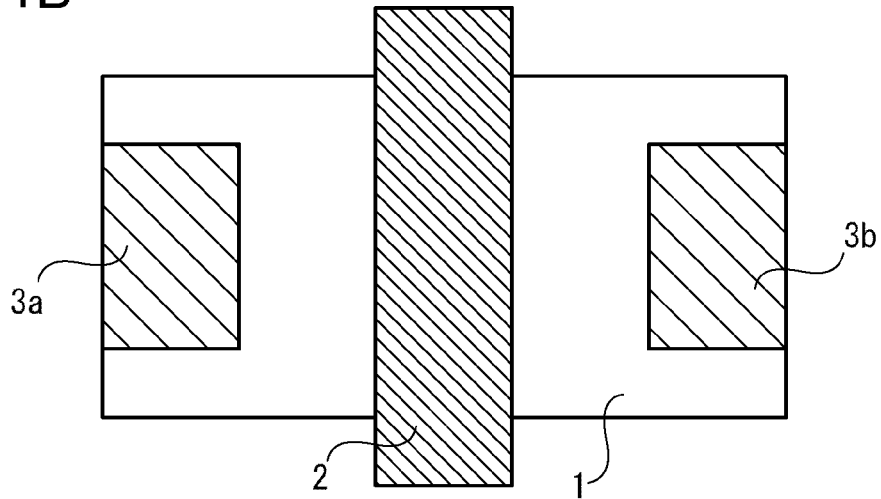
Figure 1C:
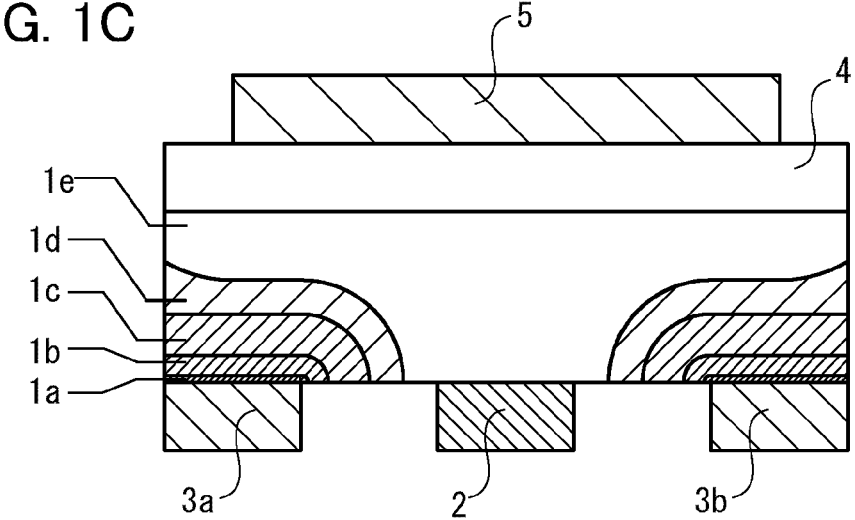

Hereinafter, embodiments will be described with reference to the drawings. Note that the embodiments can be implemented in various modes, and it is easily understood by those skilled in the art that modes and details can be changed in various ways without departing from the spirit and scope of the present invention. Therefore, the present invention is not construed as being limited to the description of the embodiments. Note that in structures described below, the same portions or portions having similar functions are denoted by the same reference numerals in different drawings, and detailed description thereof is not repeated.

Embodiment 1

Figure 4A:
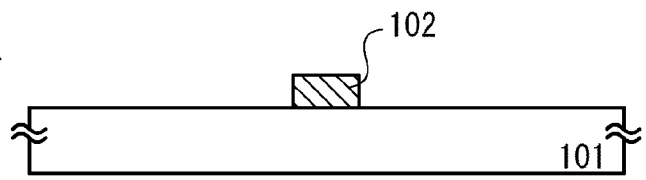
FIGS. 4A to 4F illustrate a manufacturing process of a field effect transistor of Embodiment 1.

In this embodiment, a method for manufacturing the FET illustrated in FIG. 1A will be described with reference to FIGS. 4A to 4F. First, as illustrated in FIG. 4A, a third conductor electrode 102 is formed over a substrate 101. A variety of substrates can be given as examples of the substrate 101, but the substrate 101 needs to have such a property as to withstand the subsequent treatment. Further, it is preferable that a surface of the substrate 101 has an insulating property. Accordingly, the substrate 101 is preferably a single insulator; an insulator, conductor, or semiconductor whose surface is provided with an insulating layer; or the like.

In the case of using an insulator for the substrate 101, various kinds of glasses, sapphire, quartz, ceramics, or the like can be used. In the case of using a conductor, aluminum, copper, stainless steel, silver, or the like can be used. In the case of using a semiconductor, silicon, germanium, silicon carbide, gallium nitride, or the like can be used. In this embodiment, barium borosilicate glass is used as the substrate 101.

As a material of the third conductor electrode 102, metal with a high work function, such as platinum, gold, or tungsten, can be used. Alternatively, a compound with an electron affinity of higher than or equal to 5 electron volts, such as indium nitride, may be used. The third conductor electrode 102 may include a single material of any of the above-described materials or may have a multilayer structure where a portion in contact with a semiconductor layer provided later includes any of the above-described materials. In this embodiment, the third conductor electrode 102 is formed in such a manner that a 100-nm-thick platinum film is formed by a sputtering method and then etched.

Figure 4B:
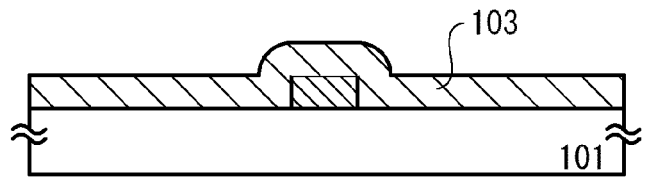
Figure 4C:
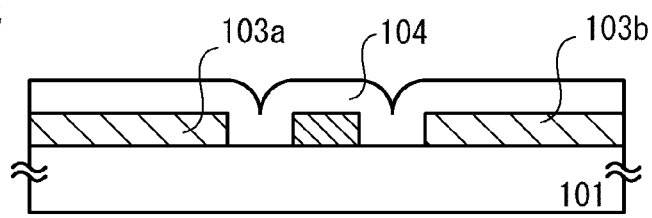

Next, as illustrated in FIG. 4B, a conductor film 103 is formed. The conductor film 103 serves as first and second conductor electrodes later. Therefore, the conductor film 103 is formed using a material suitable for the purpose. For example, titanium, molybdenum, titanium nitride, and molybdenum nitride are given. The conductor film 103 may include a single material of any of the above-described materials or may have a multilayer structure where a portion in contact with the semiconductor layer provided later includes any of the above-described materials.

Further, the conductor film 103 is formed to overlap with the third conductor electrode 102 and then patterned into a predetermined shape; therefore, it is preferable that the etching rate of a material included in the conductor film 103 be different from that of a material included in the third conductor electrode 102. In this embodiment, a 100-nm-thick titanium film is formed and then a surface thereof is nitrided so that titanium nitride is formed; this titanium nitride is used as the conductor film 103.

Next, the conductor film 103 is etched, so that a first conductor electrode 103a and a second conductor electrode 103b are formed. Further, a first insulating film 104 is formed by a sputtering method (see FIG. 4C). As a material of the first insulating film 104, silicon oxide, aluminum oxide, aluminum nitride, or the like can be used. In this embodiment, 100-nm-thick silicon oxide formed by a sputtering method is used as the first insulating film 104.

Figure 4D:
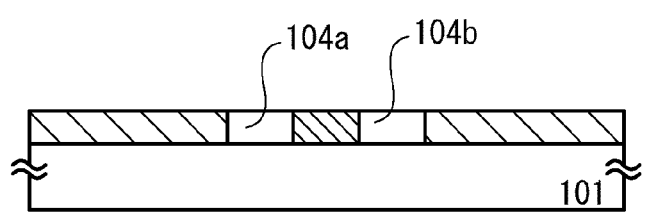

Next, the first insulating film 104 is etched by a chemical mechanical polishing method or the like, so that a surface of the substrate 101 is planarized. This etching is performed until the first conductor electrode 103a, the second conductor electrode 103b, and the third conductor electrode 102 are exposed as illustrated in FIG. 4D. As a result, a structure is obtained in which insulators 104a and 104b are embedded between the first conductor electrode 103a and the third conductor electrode 102 and between the second conductor electrode 103b and the third conductor electrode 102, respectively.

After that, an oxide semiconductor layer including indium and zinc is formed and then patterned, so that a semiconductor layer 105 is obtained. Other than the above oxide semiconductor, a variety of oxide semiconductors can be used. In this embodiment, the semiconductor layer 105 is formed in the following manner: an indium zinc oxide film having a thickness of 200 nm is formed by a sputtering method using an oxide target including equal amounts of indium and zinc.

Figure 4E:
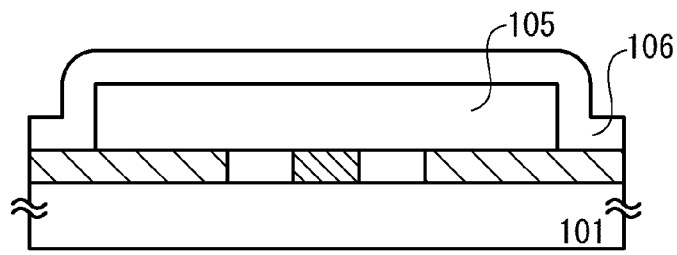

Further, a second insulating film 106 is formed by a sputtering method (see FIG. 4E). The second insulating film 106 is used as a gate insulating film. As a material of the second insulating film 106, silicon oxide, aluminum oxide, aluminum nitride, hafnium oxide, lanthanum oxide, yttrium oxide, or the like can be used. In this embodiment, aluminum oxide having a thickness of 100 nm is formed by a sputtering method as the second insulating film 106.

Appropriate heat treatment is preferably performed either after formation of the semiconductor layer 105 or after formation of the second insulating film 106 or at both of the timings. This heat treatment is for reducing the hydrogen concentration or oxygen vacancies in the semiconductor layer 105, and if possible, the heat treatment is preferably performed right after formation of the semiconductor layer 105.

Figure 4F:
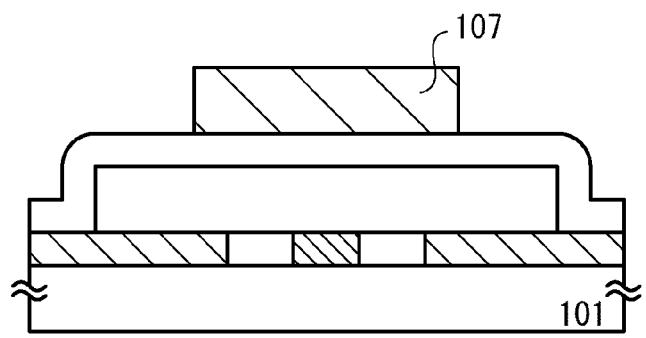

After that, a gate 107 is formed. The gate 107 is preferably formed so as to overlap with the third conductor electrode 102 and partly overlap with the first conductor electrode 103a and the second conductor electrode 103b as illustrated in FIG. 4F.

A material of the gate 107 can be metal having a high work function such as platinum, gold, or tungsten. The gate 107 may include a single material of any of the above-described materials or may have a multilayer structure where a portion in contact with the second insulating film 106 includes any of the above-described materials. In this embodiment, a 100-nm-thick platinum film and a 100-nm-thick aluminum film are formed by a sputtering method and then etched, so that the gate 107 is formed. In this manner, the FET is manufactured.

Embodiment 2

Figure 2A:
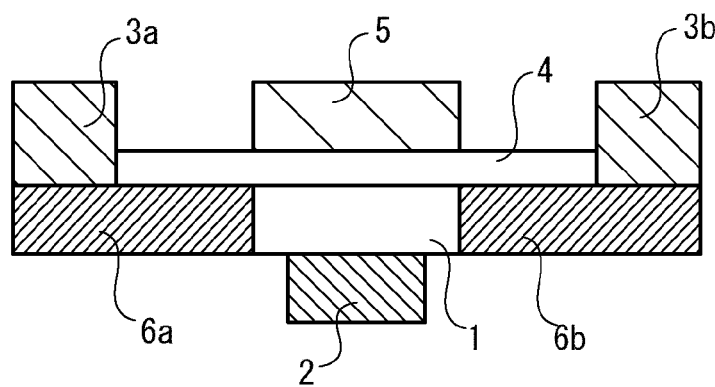
FIGS. 2A to 2D illustrate examples of a field effect transistor of the present invention.
Figure 2B:
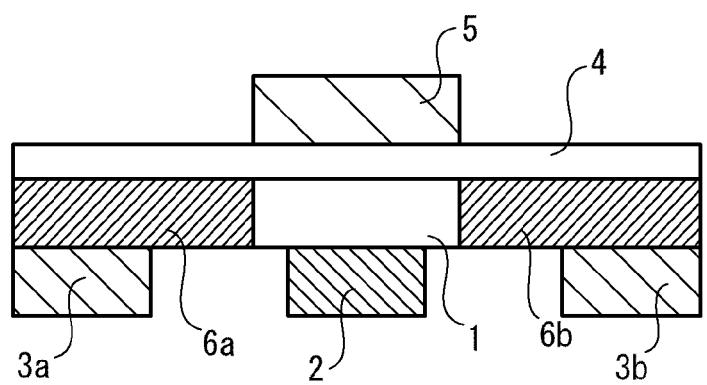
Figure 2C:
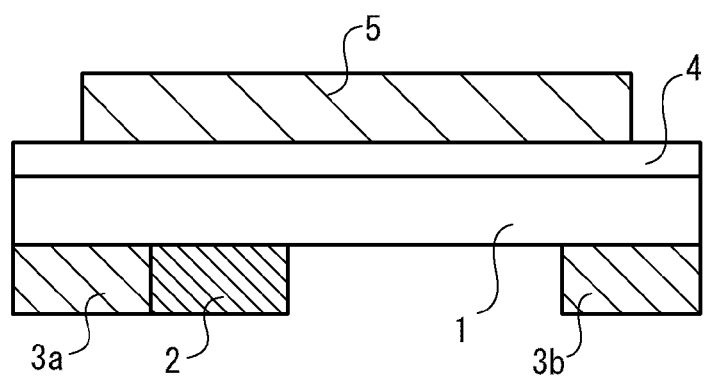
Figure 2D:
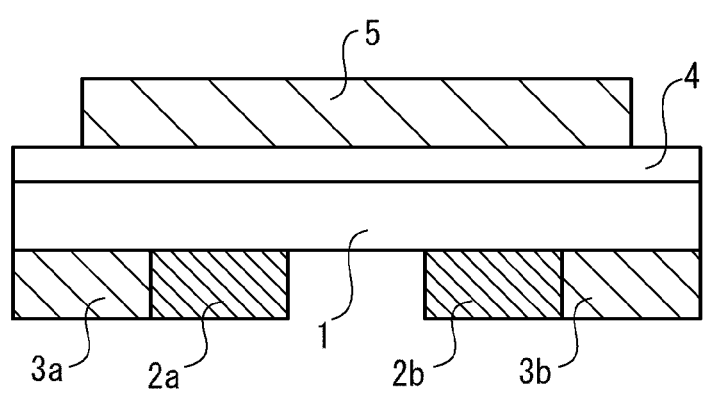
Figure 3A:
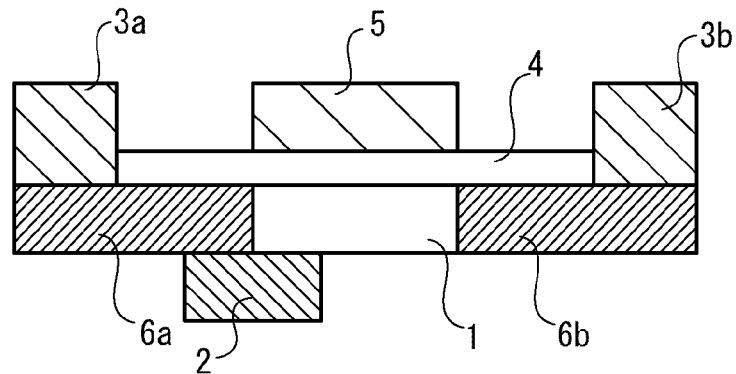
FIGS. 3A to 3D illustrate examples of a field effect transistor of the present invention.
Figure 3B:
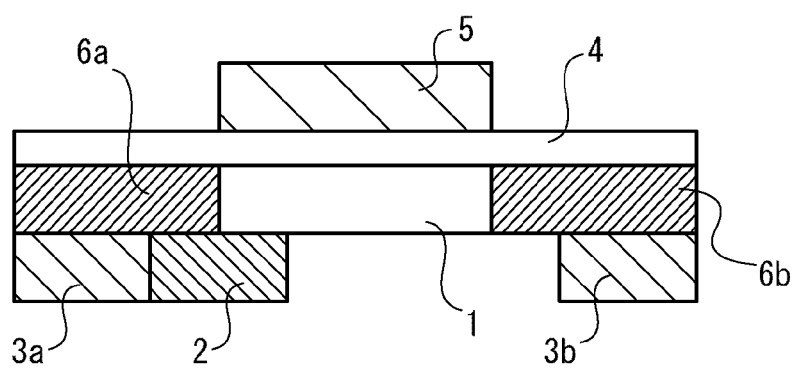
Figure 3C:
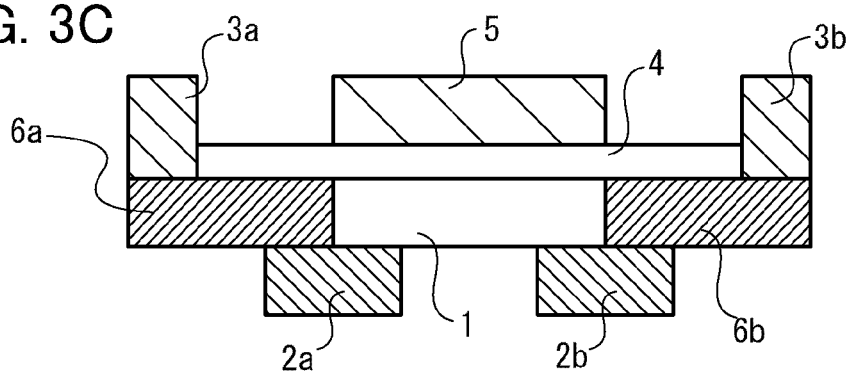
Figure 3D:
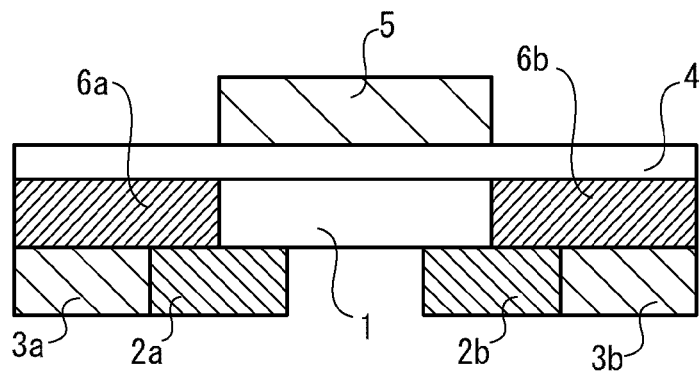
Figure 5A:
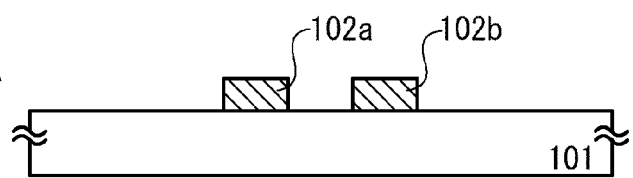
FIGS. 5A to 5G illustrate a manufacturing process of a field effect transistor of Embodiment 2.

In this embodiment, a method for manufacturing the FET illustrated in FIG. 2D will be described with reference to FIGS. 5A to 5G. First, as illustrated in FIG. 5A, a third conductor electrode 102a and a fourth conductor electrode 102b are formed over the substrate 101. In this embodiment, barium borosilicate glass is used as the substrate 101. As a material of the third conductor electrode 102a and the fourth conductor electrode 102b, 100-nm-thick platinum formed by a sputtering method is used. The platinum is etched, so that the third conductor electrode 102a and the fourth conductor electrode 102b are formed.

Figure 5B:
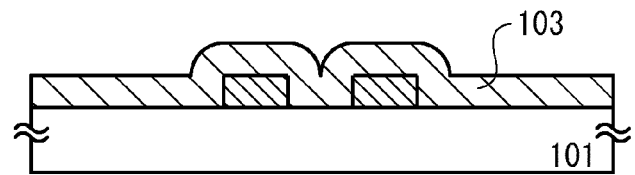

Next, as illustrated in FIG. 5B, the conductor film 103 is formed. In this embodiment, a 100-nm-thick titanium film is formed and then a surface thereof is nitrided so that titanium nitride is formed; this titanium nitride is used as the conductor film 103.

Figure 5C:
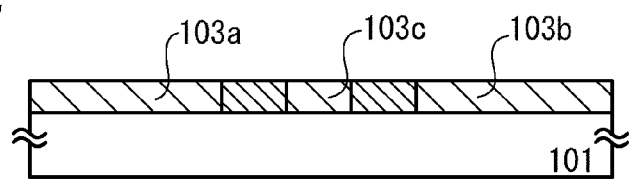

Next, the conductor film 103 is etched by a chemical mechanical polishing method or the like, so that a surface of the substrate 101 is planarized. This etching is performed until the third conductor electrode 102a and the fourth conductor electrode 102b are exposed as illustrated in FIG. 5C. As a result, a structure is obtained in which a conductor film 103c is embedded between the third conductor electrode 102a and the fourth conductor electrode 102b.

Figure 5D:
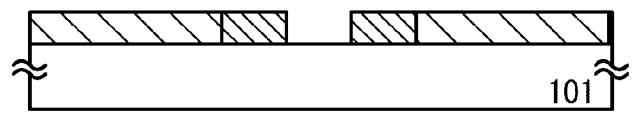
Figure 5E:
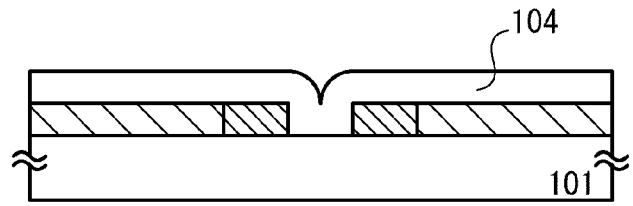

Then, as illustrated in FIG. 5D, the conductor film 103c is etched away, so that a space is formed between the third conductor electrode 102a and the fourth conductor electrode 102b. Further, as illustrated in FIG. 5E, the first insulating film 104 is formed by a sputtering method. In this embodiment, 100-nm-thick silicon oxide formed by a sputtering method is used as the first insulating film 104.

Figure 5F:
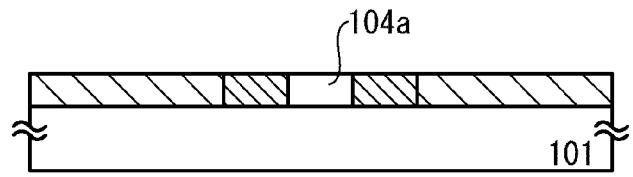

Next, the first insulating film 104 is etched by a chemical mechanical polishing method or the like, so that the surface of the substrate 101 is planarized. This etching is performed until the first conductor electrode 103a, the second conductor electrode 103b, the third conductor electrode 102a, and the fourth conductor electrode 102b are exposed as illustrated in FIG. 5F. As a result, a structure is obtained in which the insulator 104a is embedded between the third conductor electrode 102a and the fourth conductor electrode 102b.

After that, the semiconductor layer 105 is formed in the following manner: an indium zinc gallium oxide film having a thickness of 200 nm is formed by a sputtering method using an oxide target including equal amounts of indium, zinc, and gallium and then the film is patterned. Further, the second insulating film 106 is formed from 100-nm-thick aluminum oxide formed by a sputtering method.

Figure 5G:
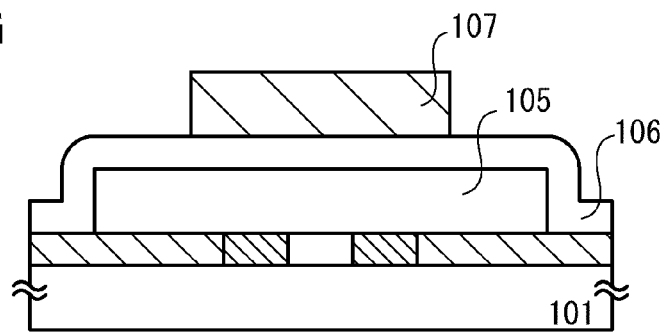

Then, a 100-nm-thick platinum film and a 100-nm-thick titanium film are formed by a sputtering method and then etched, so that the gate 107 is formed. The gate 107 is preferably formed so as to overlap with the third conductor electrode 102a and the fourth conductor electrode 102b and partly overlap with the first conductor electrode 103a and the second conductor electrode 103b as illustrated in FIG. 5G. In this manner, the FET is manufactured.

Embodiment 3

In this embodiment, a method for manufacturing the FET illustrated in FIG. 2A will be described with reference to FIGS. 6A to 6E. First, the third conductor electrode 102 is formed over the substrate 101. In this embodiment, barium borosilicate glass is used as the substrate 101. The third conductor electrode 102 is formed in such a manner that a 100-nm-thick platinum film is formed by a sputtering method and then etched.

Figure 6A:
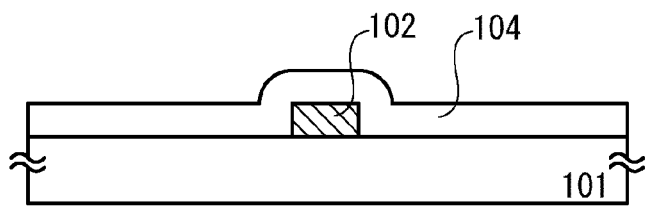
FIGS. 6A to 6E illustrate a manufacturing process of a field effect transistor of Embodiment 3.

Next, as illustrated in FIG. 6A, the first insulating film 104 is formed. In this embodiment, 100-nm-thick silicon oxide formed by a sputtering method is used as the first insulating film 104.

Figure 6B:
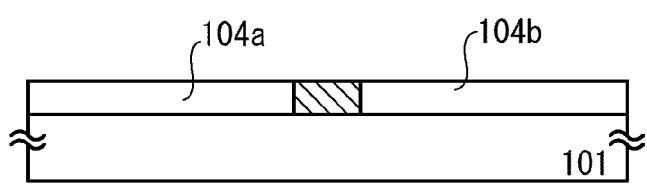

Next, the first insulating film 104 is etched by a chemical mechanical polishing method or the like, so that a surface of the substrate 101 is planarized. This etching is performed until the third conductor electrode 102 is exposed as illustrated in FIG. 6B. As a result, a structure is obtained in which the third conductor electrode 102 is embedded between the insulator 104a and an insulator 104b.

After that, as the semiconductor layer 105, a 200-nm-thick indium zinc gallium oxide film is formed by a sputtering method using an oxide target including indium, zinc, and gallium at a ratio of 2:2:1. Further, the second insulating film 106 is formed using 100-nm-thick aluminum oxide formed by a sputtering method.

Figure 6C:
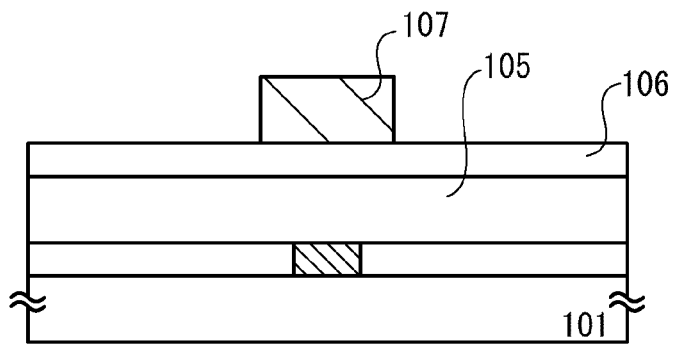

Then, a 50-nm-thick platinum film and a 150-nm-thick aluminum film are formed by a sputtering method and then etched, so that the gate 107 is formed. As illustrated in FIG. 6C, the gate 107 is preferably formed so as to overlap with the third conductor electrode 102.

Then, with the use of the gate 107 as a mask, an ion having an effect of reducing the indium zinc gallium oxide, such as a phosphorus ion, a boron ion, or a titanium ion, is introduced into the semiconductor layer 105 by an ion implantation method.

Figure 6D:
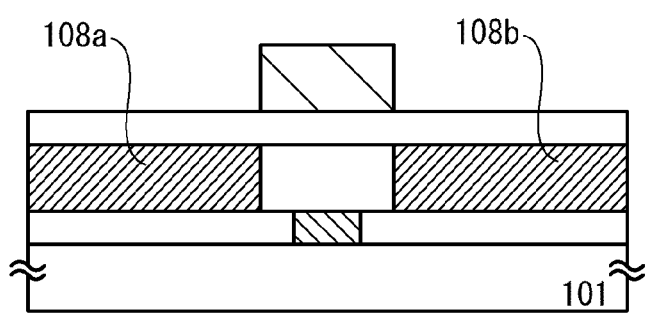

In this embodiment, a phosphorus ion is used. A phosphorus ion is used also in a silicon semiconductor process and the ion does not travel in an FET owing to its large ionic radius; therefore, the use of a phosphorus ion is advantageous in terms of stability and reliability of the characteristics of the FET. In this manner, a first doped region 108a and a second doped region 108b are formed as illustrated in FIG. 6D.

After that, a 300-nm-thick silicon oxide film is formed by a CVD method as a third insulating film 109. A surface of the third insulating film 109 is planarized by a chemical mechanical polishing method or the like. Then, contact holes that reach the first doped region 108a and the second doped region 108b are formed in the third insulating film 109 and the second insulating film 106, and the first conductor electrode 103a and the second conductor electrode 103b are formed.

Figure 6E:
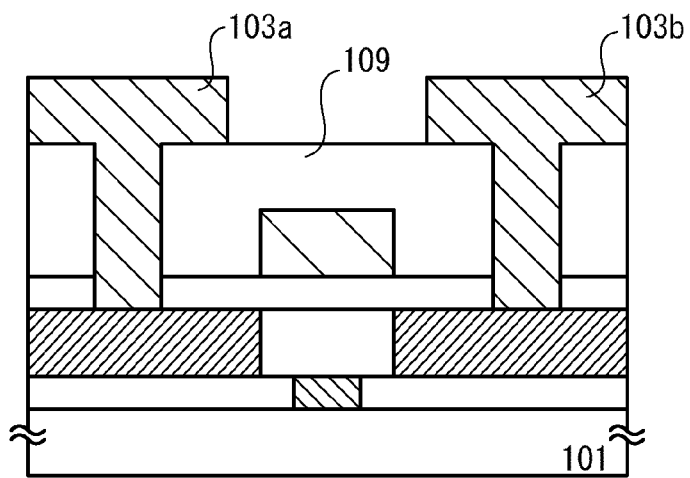
Figure 7A:
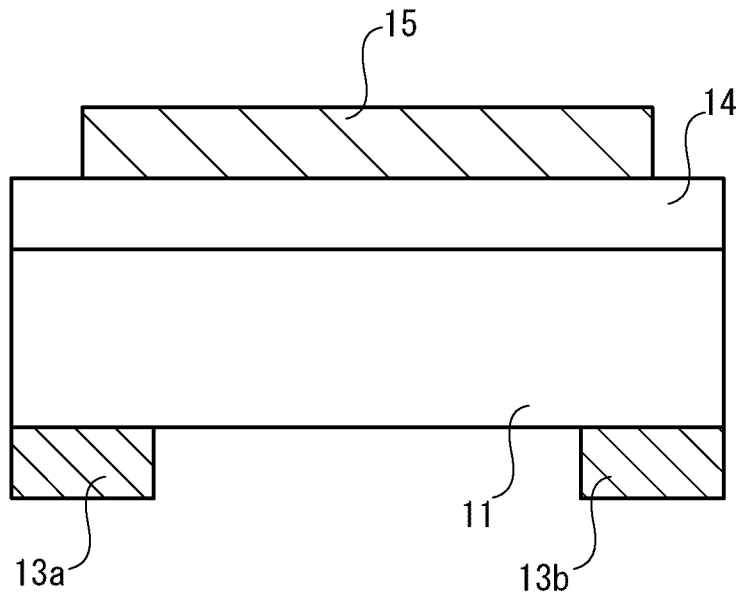
FIGS. 7A and 7B illustrate an example of a conventional field effect transistor and operation thereof.
Figure 7B:
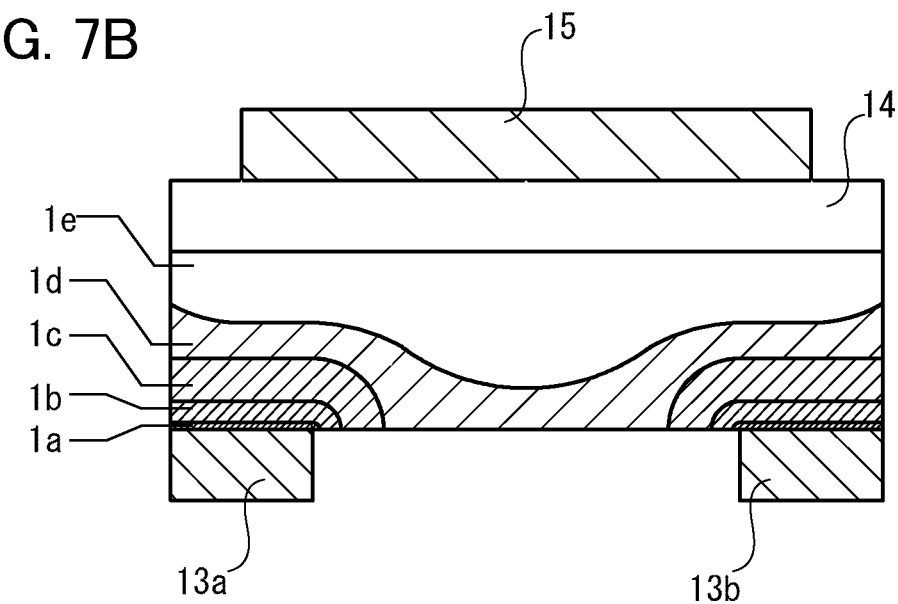

In this embodiment, a 50-nm-thick titanium nitride film and a 150-nm-thick titanium film are successively formed by a sputtering method and then patterned, so that the first conductor electrode 103a and the second conductor electrode 103b are formed. In this manner, the FET illustrated in FIG. 6E is manufactured.

Embodiment 4

The semiconductor devices described in Embodiments 1 to 3 can be used in a variety of electronic devices, for example, in driver circuits for display devices such as liquid crystal displays, electro luminescent (EL) displays, and field emission (FE) displays, driver circuits for image sensors, semiconductor memories, and the like. Further, the semiconductor devices described in Embodiments 1 to 3 can be used in electronic devices including the above-described electronic devices, for example, in television sets, personal computers, communication devices such as mobile phones, electronic notebooks, portable music players, and the like.

This application is based on Japanese Patent Application serial no. 2010-027835 filed with Japan Patent Office on Feb. 10, 2010, the entire contents of which are hereby incorporated by reference.

The invention claimed is:

1. A field effect transistor comprising:
a semiconductor layer including a first surface and a second surface opposed to the first surface;
a first conductor electrode in contact with the first surface of the semiconductor layer;
a second conductor electrode in contact with the first surface of the semiconductor layer;
a gate provided over the second surface of the semiconductor layer; and
a third conductor electrode in contact with the first surface of the semiconductor layer and between the first conductor electrode and the second conductor electrode so as to cross the semiconductor layer,
wherein a material of the semiconductor layer is an oxide semiconductor.

2. The field effect transistor according to claim 1, further comprising a fourth conductor electrode provided in contact with the first surface, so as to cross the semiconductor layer and be apart from the third conductor electrode.

3. The field effect transistor according to claim 2,
wherein the third conductor electrode is in contact with one of the first conductor electrode and the second conductor electrode, and
wherein the fourth conductor electrode is in contact with the other of the first conductor electrode and the second conductor electrode.

4. The field effect transistor according to claim 2,
wherein the third conductor electrode is kept at the same potential as one of the first conductor electrode and the second conductor electrode, and
wherein the fourth conductor electrode is kept at the same potential as the other of the first conductor electrode and the second conductor electrode.

5. The field effect transistor according to claim 1,
wherein the third conductor electrode is kept at the same potential as one of the first conductor electrode and the second conductor electrode.

6. The field effect transistor according to claim 1,
wherein the semiconductor layer comprises a first doped region and a second doped region that include a donor or an acceptor at a high concentration.

7. The field effect transistor according to claim 6,
wherein concentrations of the donor or the acceptor in the first doped region and the second doped region are higher than or equal to $1 \times 10^{18}/cm^3$ and lower than $1 \times 10^{21}/cm^3$.

8. The field effect transistor according to claim 1,
wherein work functions of portions of the first conductor electrode and the second conductor electrode, which are in contact with the semiconductor layer, are lower than a sum of an electron affinity of the semiconductor layer and 0.3 electron volts.

9. The field effect transistor according to claim 1,
wherein a junction between the first conductor electrode and the semiconductor layer and a junction between the second conductor electrode and the semiconductor layer are each an ohmic junction.

10. The field effect transistor according to claim 1,
wherein a work function of a portion of the third conductor electrode, which is in contact with the semiconductor layer, is higher than a sum of an electron affinity of the semiconductor layer and 0.6 electron volts.

11. The field effect transistor according to claim 1,
wherein a junction between the third conductor electrode and the semiconductor layer is a Schottky barrier junction.

12. The field effect transistor according to claim 1, further comprising a gate insulating film between the semiconductor layer and the gate.

* * * * *